United States Patent [19]

Cowley

[11] Patent Number: 4,922,548
[45] Date of Patent: May 1, 1990

[54] FREQUENCY SIGNAL SYNTHESISER

[75] Inventor: Nicholas P. Cowley, Wiltshire, England

[73] Assignee: Plessey Overseas Limited, Ilford, England

[21] Appl. No.: 358,796

[22] Filed: May 30, 1989

[30] Foreign Application Priority Data

May 31, 1988 [GB] United Kingdom ............... 8812895

[51] Int. Cl.⁵ .......................................... H04J 1/08
[52] U.S. Cl. ................................. 455/183; 328/14; 331/1 A
[58] Field of Search ............... 455/179, 183, 184, 165; 358/181, 183, 189, 191.1; 307/510, 525, 527; 328/14; 331/1 A, 18, 25

[56] References Cited

U.S. PATENT DOCUMENTS

| | | | |
|---|---|---|---|
| 4,296,380 | 10/1981 | Minakuchi | 328/14 |
| 4,296,407 | 10/1981 | Minakuchi | 328/14 |
| 4,330,758 | 5/1982 | Swisher et al. | 331/1 A |
| 4,809,069 | 2/1989 | Meyer et al. | 358/37 |

Primary Examiner—Reinhard J. Eisenzopf
Assistant Examiner—Edward Urban
Attorney, Agent, or Firm—Fleit, Jacobson, Cohn, Price, Holman & Stern

[57] ABSTRACT

In the present invention a switchable synthesizer is disclosed wherein a single loop is used to lock any one of a plurality of control signals by multiplexing the frequencies into and control signals out of the specific frequencies loop to control the frequency generators.

7 Claims, 1 Drawing Sheet

FREQUENCY SIGNAL SYNTHESISER

FIELD OF THE INVENTION

The present invention relates to a frequency signal synthesiser and more particularly, but not exclusively, to such a synthesiser for use in television receivers.

DESCRIPTION OF THE PRIOR ART

There is a requirement to generate locally, ie in a receiver, radio frequency signals in order that information can be de-tuned from received signals. This local radio frequency is generated by a frequency synthesiser.

Typically, a frequency synthesiser comprises a radio frequency source in a feedback loop and a comparison frequency source. Each source provides a signal to a frequency mixer whereby a stable or "locked" radio frequency signal can be constituted by discrepancy feedback to adjust the radio frequency source. Each radio frequency signal to be generated requires a separate feedback loop for its control.

It is becoming a common requirement in receivers, particularly those for television, to be able simultaneously to tune to two or more channels. With television receivers this allows provision of the so-called picture-in-picture facility. Each channel however presently requires a separate, distinct frequency synthesiser, and thus receivers that have simultaneous tuning are relatively expensive and are complex.

BRIEF SUMMARY OF THE INVENTION

It is an objective of the present invention to provide a frequency synthesiser that allows simultaneous tuning of two or more channels but which avoids the necessity of separate frequency synthesiser loops.

According to the present invention, there is provided a frequency signal synthesiser comprising a comparison frequency generating element to provide a comparison frequency signal, a multiplexer element for selecting one of a plurality of generated radio frequency signals, a frequency divider element, and a frequency mixer element and control means, the frequency synthesiser, in operation being arranged whereby the multiplexer element is coupled to feed a selected one of the plurality of radio frequencies to the frequency divider element whilst the control means is coupled to the divider element such that a respective one of a series of divider words is fed to the divider element and each radio frequency signal is divided by it's respective divider word to provide a common divided frequency signal, the comparison frequency signal and the divided frequency signal being fed to the frequency mixer element to provide a control signal indicative of frequency difference between the comparison frequency signal and the divided frequency signal, the control signal controlling the respective radio frequency signal.

DETAILED DESCRIPTION OF THE INVENTION

Figure 1:
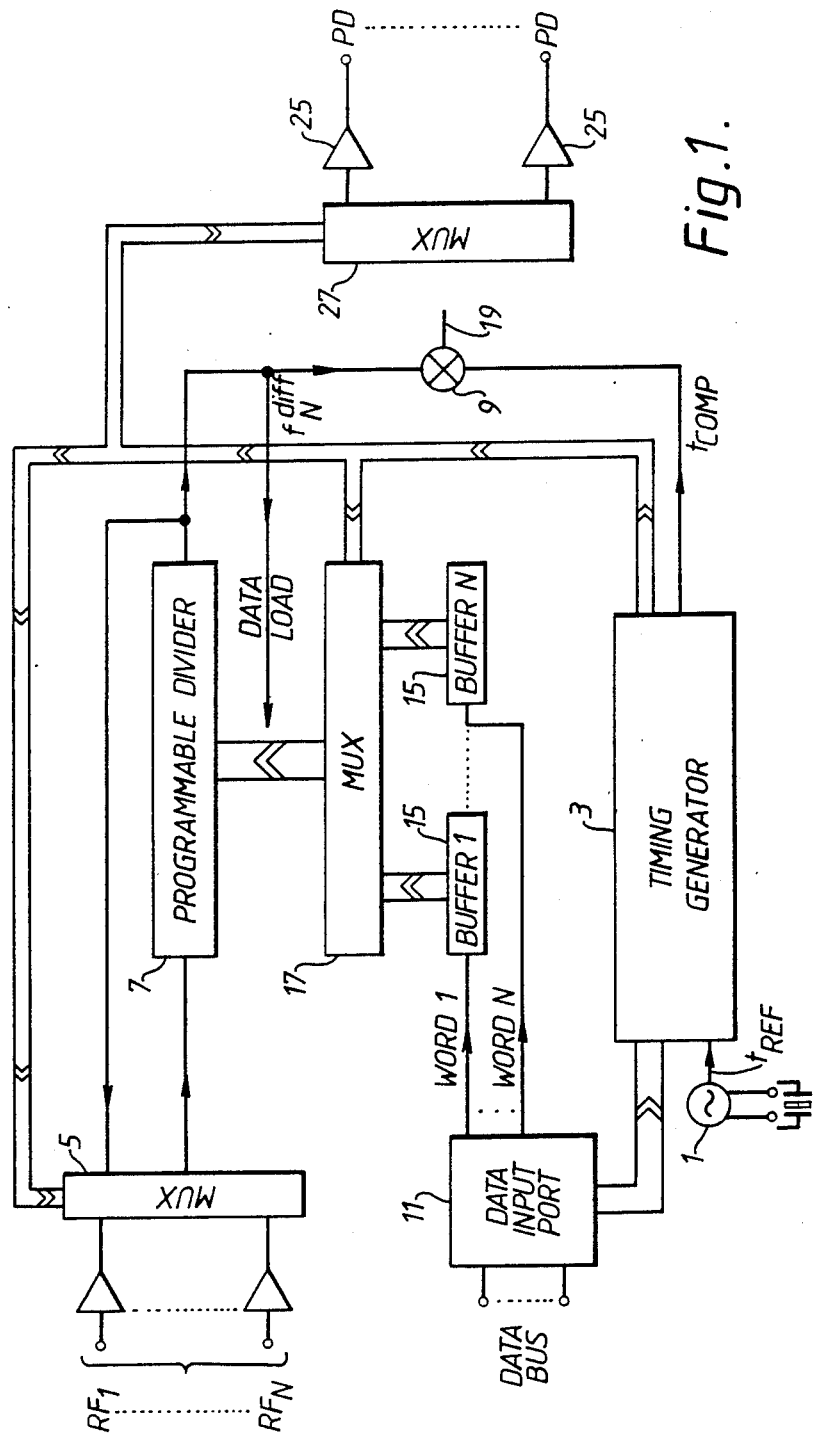

An embodiment of the present invention will now be described by way of example only with reference to the accompanying drawing, FIG. 1. FIG. 1 illustrates, in a block diagram form, a frequency synthesiser according to the present invention.

Consider FIGURE 1. An oscillator 1 (preferably a crystal oscillator) provides a reference frequency $F_{ref}$ which is configured through a timing generator 3 to constitute a comparison frequency $F_{comp}$. A plurality of radio frequency signals ($RF_1$... $RF_N$) are coupled in parallel to a first multiplexer 5. The multiplexer 5 is coupled to a programmable divider element 7. The programmable divider element 7 is coupled to a frequency mixer element 9. The frequency mixer element 9 is also arranged to receive the comparison frequency $F_{comp}$ such that a control signal can be provided that is indicative of the difference between the comparison frequency signal $F_{comp}$ and the dividend signal $F_{div}$.

In the present invention, a relatively high comparison frequency is employed such that, under suitable control, the synthesiser can be multiplexed to provide the control of the number of corresponding synthesised radio frequency signals at about the same accuracy as with a conventional single synthesised radio frequency signal. The comparison frequency signal $F_{comp}$ is constant. The radio frequency signals are multiplexed between RF1 to RFN where RF indicates radio frequency and N is the number of different radio frequency signals. The dividend of the divider element 7 is a signal $F_{div}$ which is approximately equal to the comparison frequency $F_{comp}$ and is compared therewith. The use of a relatively high comparison frequency $F_{comp}$ results, after multiplexing, in a nett individual loop comparison frequency similar to that of existing high performance frequency synthesisers.

The present frequency synthesiser is controlled through a data input port 11 which feeds respective divider words into data buffers (1-N) 15 and stimulates the timing generator 3. The buffers 15 are coupled in parallel to a divider multiplexer 17 which in turn is coupled to the divider element 7. The timing generator 3 is coupled to the divider multiplexer 15 and the radio frequency multiplexer 5 to provide time sequencing such that a radio frequency RFN and its corresponding divider word are incident upon the program divider 7 at the correct time, to give a dividend frequency substantially equal to $F_{div}$.

When in operation, the synthesiser has a master control cycle comprising several sub-cycles of a possibly unequal nature i.e. time span. This is because the frequency control of the in-picture picture does not need to be as stable as that of the main picture. The timing generator 3 ensures that during each subcycle a buffered divider word and corresponding radio frequency RFN are multiplexed into the divider element 7. Thus, the respective radio frequency generator (not shown) can be controlled by its control signal 19. The control signals 19 are fed to a varactor PDN of the respective RFN generator through a control multiplexer 27 and control line 25. Each varactor PDN is thereby arranged to adjust the generation of its respective radio frequency RFN.

The present frequency synthesiser is further timed by the timing generator 3 such that switching between sub-cycles and control signals occurs during a quiescent portion of the programmable divider words i.e. at the end of a count. Thus, minimising the perturbation of the programmable divider varactor upon switching is minimised.

In the present frequency synthesiser, it is advantageous to buffer the signal to each varactor through a memory (e.g. including a capacitor). With such a memory element, each radio frequency generating loop requires only one loop amplifier and filter. Furthermore, the particular varactors will be maintained at their respective control signal 19 voltages during their uncontrolled period, to maintain their radio frequency loop locks.

It will be appreciated that the present frequency synthesiser replaces N synthesisers, N reference oscillators, N loop amplifiers, N loop filters and N data bus highways by common moding and having associated components.

What I claim is:

1. A frequency signal synthesiser comprising a comparison frequency generating element to provide a comparison frequency signal, a multiplexer element for selecting one of a plurality of generated radio frequency signals, a frequency divider element, a frequency mixer element and control means, the frequency synthesiser, in operation, being arranged whereby the multiplexer element is coupled, to feed a selected one of the plurality of radio frequency to the frequency divider element whilst the control means is coupled to the divider element such that a respective one of a series of divider words are fed to the divider element and each radio frequency signal is divided by its respective divided word to provide a common dividend frequency signal, the comparison frequency signal and the dividend frequency signal being fed to the frequency mixer element to provide a control signal indicative of frequency difference between the comparison frequency signal and the dividend frequency signal, the control signal being arranged to control it's respective radio frequency signal.

2. A synthesiser as claimed in claim 1 wherein the comparison frequency generating element is a crystal oscillator.

3. A synthesiser as claimed in either claim 1 wherein the synthesiser in operation is controlled by the control means such that a control time cycle is defined comprising a plurality of sub-cycles, each of the plurality of generated radio frequency signals being attributed to a sub-cycle whereby frequency lock for that generated radio frequency is determined in that sub-cycle.

4. A synthesiser as claimed in claim 3 wherein a timing generator is provided to define, in operation, the control time cycle.

5. A synthesiser as claimed in claim 1 wherein the frequency mixer element is coupled to a control multiplexer element whereby each control signal can be fed to control its respective generated radio frequency through a control line.

6. A synthesiser as claimed in claim 5 wherein the control line includes a memory element whereby the control signal can be maintained upon the control whilst the synthesiser proceeds through the pre-determined sequence.

7. A synthesiser as claimed in claim 1 including a plurality of buffers, each buffer being arranged to hold a divider word, and multiplexing means controlled by the control means to feed a corresponding divider word to the divider element when the multiplexer element feeds a selected ratio frequency thereto.

* * * * *